(12) United States Patent
Nakanishi et al.

(10) Patent No.: US 10,193,579 B2
(45) Date of Patent: Jan. 29, 2019

(54) STORAGE CONTROL DEVICE, STORAGE SYSTEM, AND STORAGE CONTROL METHOD

(71) Applicant: Toshiba Memory Corporation, Minato-ku, Tokyo (JP)

(72) Inventors: Keiri Nakanishi, Kawasaki Kanagawa (JP); Katsuyuki Nomura, Hino Tokyo (JP); Sho Kodama, Kawasaki Kanagawa (JP); Youhei Fukazawa, Kawasaki Kanagawa (JP); Kazuki Inoue, Kawasaki Kanagawa (JP); Kojiro Suzuki, Kawasaki Kanagawa (JP); Harutaka Goto, Kamakura Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 17 days.

(21) Appl. No.: 15/258,193

(22) Filed: Sep. 7, 2016

(65) Prior Publication Data
US 2017/0070244 A1     Mar. 9, 2017

Related U.S. Application Data

(60) Provisional application No. 62/215,192, filed on Sep. 8, 2015.

(51) Int. Cl.
*H03M 13/00*     (2006.01)
*G06F 3/06*     (2006.01)
(Continued)

(52) U.S. Cl.
CPC ........ *H03M 13/6318* (2013.01); *G06F 3/064* (2013.01); *G06F 3/0608* (2013.01);
(Continued)

(58) Field of Classification Search
None
See application file for complete search history.

(56) References Cited

U.S. PATENT DOCUMENTS

| 2011/0161774 A1* | 6/2011 | Shin ................. G06F 11/1012 |
| | | 714/755 |
| 2011/0238903 A1* | 9/2011 | Ban .................. G11C 16/349 |
| | | 711/103 |

(Continued)

FOREIGN PATENT DOCUMENTS

| JP | 2013-045428 A | 3/2013 |
| JP | 2014-186614 A | 10/2014 |

*Primary Examiner* — Mujtaba M Chaudry
(74) *Attorney, Agent, or Firm* — White & Case LLP

(57) ABSTRACT

According to an embodiment, a storage control device includes a controller, a compression condition determiner, a compressor, and an error correction encoder. The controller receives a write request for a data item and determines whether or not the wear degree of a target region in a storage device to which the data item is to be written is less than a threshold value. The compression condition determiner determines, based on the wear degree, an optimal compression condition out of compression conditions that include lossy compression. The compressor generates, based on the compression condition, compressed data. The error correction encoder subjects the data item to error correction and generates encoded data.

16 Claims, 6 Drawing Sheets

(51) Int. Cl.
*H03M 7/00* (2006.01)
*H03M 13/29* (2006.01)
*H03M 7/30* (2006.01)

(52) U.S. Cl.
CPC .......... *G06F 3/0619* (2013.01); *G06F 3/0661* (2013.01); *G06F 3/0673* (2013.01); *H03M 7/00* (2013.01); *H03M 7/6041* (2013.01); *H03M 13/2906* (2013.01); *H03M 13/6312* (2013.01)

(56) References Cited

U.S. PATENT DOCUMENTS

| | | | |
|---|---|---|---|
| 2012/0278533 A1 | 11/2012 | Suzuki et al. | |
| 2013/0103891 A1* | 4/2013 | Sharon | G06F 12/0246 711/103 |
| 2013/0159600 A1* | 6/2013 | Dror | G06F 12/0246 711/103 |
| 2015/0067436 A1* | 3/2015 | Hu | G06F 11/1008 714/758 |
| 2015/0169462 A1* | 6/2015 | Vaisanen | G06F 21/78 711/166 |
| 2016/0078045 A1* | 3/2016 | Ebsen | G06F 17/30221 707/693 |

* cited by examiner

STORAGE CONTROL DEVICE, STORAGE SYSTEM, AND STORAGE CONTROL METHOD

CROSS-REFERENCE TO RELATED APPLICATIONS

This application is based upon and claims the benefit of priority from the prior U.S. Provisional Patent Application No. 62/215,192 filed on Sep. 8, 2015, the entire contents of which are incorporated herein by reference.

FIELD

Embodiments of the present invention relate to a storage control device, a storage system, and a storage control method.

BACKGROUND

Error correction is known as a technique to save a data item written to a storage device from corruption. In the error correction, a data item to which a redundancy bit is added to give an error correction capability is written to a storage device, and a data item read from the storage device is subjected to error correction based on the error correction capability.

In addition, to suppress the deterioration of a storage device, the amount of data writing to the storage device is reduced by compressing data.

However, there has been a problem with this technique in that, when a storage device is fresh out of box (FOB), that is, brand new, an excessive error correction capability prevents the amount of data writing from being reduced sufficiently.

DETAILED DESCRIPTION

Embodiments will now be explained with reference to the accompanying drawings. The present invention is not limited to the embodiments.

According to an embodiment, a storage control device includes a controller, a compression condition determiner, a compressor, and an error correction encoder. The controller receives a write request for a data item and determines whether or not the wear degree of a target region in a storage device to which the data item is to be written is less than a threshold value. The compression condition determiner determines, based on the wear degree, an optimal compression condition out of compression conditions that include lossy compression. The compressor generates, based on the compression condition, compressed data. The error correction encoder subjects the data item to error correction and generates encoded data.

First Embodiment

First, as a first embodiment, there will be described a storage system 1 that controls, with hardware, how to store data using lossy compression.

Figure 1:
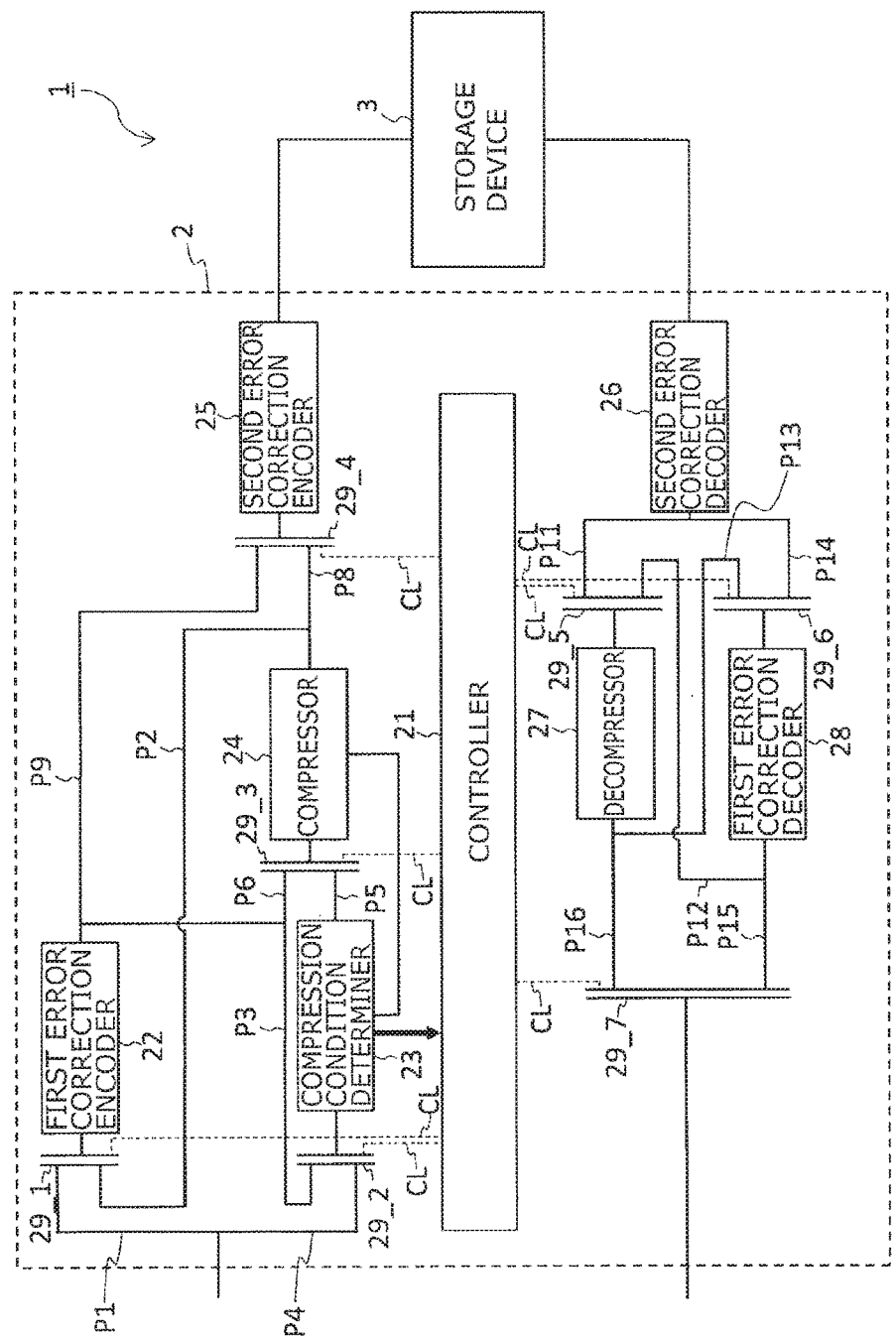
FIG. 1 is a diagram of a storage system illustrating a first embodiment.

FIG. 1 is a diagram of a storage system 1 illustrating the first embodiment. The storage system 1 is available for, for example, a solid state drive (SSD). The storage system 1 includes a storage control device 2 and a storage device 3. The storage control device 2 is, for example, a piece of hardware such as a semiconductor integrated circuit. The storage device 3 is, for example, a nonvolatile storage device such as a NAND flash memory.

The storage control device 2 includes a controller 21, a first error correction encoder 22, a compression condition determiner 23, a compressor 24, a second error correction encoder 25, a second error correction decoder 26, a decompressor 27, and a first error correction decoder 28. The controller 21 is also a wear degree determiner.

In addition, the storage control device 2 includes first to seventh selectors 29_1 to 29_7. Each of the selectors 29_1 to 29_7 is, for example, a multiplexer and is controlled by the controller 21 via a control line CL.

The controller 21 determines whether or not a wear degree of a writing target region in the storage device 3 is less than the threshold value, the writing target region being a region to which writing of a first writing target data item is specified.

The first writing target data item is a data item that is to be subjected to data processing for writing, such as error correction coding and compression. The first writing target data is input from, for example, a host device (not illustrated). The first writing target data item is converted into a write data item by the storage control device 2 and stored in the storage device 3.

The wear degree is a degree of deterioration of a writing target region. For example, the wear degree is the number of writings of data to a writing target region, the presence/absence of defective information in the writing target region, writing/reading error information, otherwise information that is calculated from the number of writings, the defective information, or the writing/reading error information. The wear degree is stored, as wear degree information, in the controller 21 or the storage device 3.

The threshold value of wear degree is a value on which it can be determined that the first error correction encoder 22 is an excessive error correction capability. A specific mode of the threshold value of wear degree is not especially limited. For example, the threshold value of wear degree may be a value on which it can be determined whether or not a writing target region is FOB, or may be a lower limit value of wear degree.

In writing, the storage control device 2 controls the first to fourth selectors 29_1 to 29_4 using the controller 21 to convert the first writing target data item in accordance with the compression condition into the write data item. For example, when the wear degree is less than the threshold value, the selectors are controlled such that the first writing target data passes through the first error correction encoder 22, the compressor 24, and the second error correction encoder 25 in this order, whereby the storage control device 2 generates the write data item and stores the write data item in the storage device 3.

In addition, in reading, the storage control device 2 controls, based on the wear degree information the fifth to seventh selectors 29_5 to 29_7 using the controller 21. Then, the storage control device 2 decodes a read data item from the storage device 3 in accordance with the compression condition. For example, when the wear degree is less than the threshold value, the selectors are controlled such that the read data item passes through the second error correction decoder 26, the decompressor 27, and the first error correction decoder 28 in this order, whereby the storage control device 2 decodes and outputs the read data item.

The first error correction encoder 22 generates, a first encoded data item. To the first error correction encoder 22, the first writing target data item or an output data item from the compressor 24 (compressed data) is input by the first selector 29_1. For example, the first error correction encoder 22 adds first bits to the input data item to generate the first encoded data item.

The first encoded data item differs depending on the input data. The larger the number of the first bits, the higher an error correction capability becomes, and the longer a code length becomes. The first bits are, for example, redundancy bits such as parity bits.

The compression condition determiner 23 determines, based on the wear degree, a compressing method that gives the shortest code length after the compression of the input data item, as a compression condition, and notifies the compressing method to the compressor 24. The compression condition determiner 23 receives a first writing target data item or a first encoded data item by a second selector 29_2. Specifically, the compression condition determiner 23 changes the first writing target data item or the first encoded data item in a range within which error correction can be performed, and determines the compressing method that gives the shortest code length after the compression.

The compressing method includes lossy compression. In the lossy compression, a data item is changed in the range within which the error correction can be performed, and compressed. In the present embodiment, in the case where the wear degree is less than the threshold value, the lossy compression can be selected. The lossy compression can reduce the code length after the compression. In addition, the compressing methods include lossless compression, non-compression, and the like. For example, the lossy compression is to compress a data item that is changed in the range within which the error correction can be performed.

Here, the change of the data item is bit inversion. The lossless compression is to compress a data item in its original state without changing the data item. In the case where the wear degree is less than the threshold value, by using the lossy compression, it is possible to avoid an excessive change to the extent that the error correction cannot be performed, and to give the shortest code length after the compression.

The compressor 24 can support a plurality of compressing methods according to the compression conditions. The compressor 24 generates a compressed data item of an input data item according to a compression condition. The compressor 24 receives a first error correction code or an output data item from the compression condition determiner 23 by a third selector 29_3. The compressor 24 generates a compressed data item of the first error correction code or the output data item from the compression condition determiner 23, under a predetermined lossless compression scheme such as run-length encoding (RLE) and dictionary encoding.

The second error correction encoder 25 generates a second encoded data item (write data item). The second error correction encoder 25 is disposed in a stage subsequent to the compressor 24 and the first error correction encoder 22, receiving a compressed data item or a first encoded data item by a fourth selector 29_4. The second error correction encoder 25 adds, for example, second bits to the compressed data item or the first encoded data item to generate a second encoded data item.

Then, the second error correction encoder 25 writes the second encoded data item to a writing target region in the storage device 3.

The second error correction decoder 26 subjects a read data item from the storage device 3 to decoding supported by the second error correction encoder 25 to generate a second decoded data item.

The decompressor 27 receives a second decoded data item or an output data item from the first error correction decoder 28 (first decoded data item) by a fifth selector 29_5. The decompressor 27 receives, from the controller 21, information on whether or not the a read data item has been compressed, and decompresses the received data item based on a decompression condition to generate a decompressed data item.

The decompression condition is contained in, for example, the header of the read data item.

The first error correction encoder 28 receives a decompressed data item or a second decoded data item by a sixth selector 29_6. The first error correction decoder 28 performs decoding supported by the first error correction encoder 22 to generate a first decoded data item.

That is, the controller 21 controls the fifth to seventh selectors based on the wear degree and the compression condition of the time of writing, and the storage control device 2 decodes a read data item from the storage device 3. In the storage control device 2, a decompressed data item or a first decoded data item is selected by a seventh selector 29_7, and a read data item that has been decoded is output.

(Writing to and Reading from Writing Target Region Having Wear Degree Less than Threshold Value)

Figure 2:
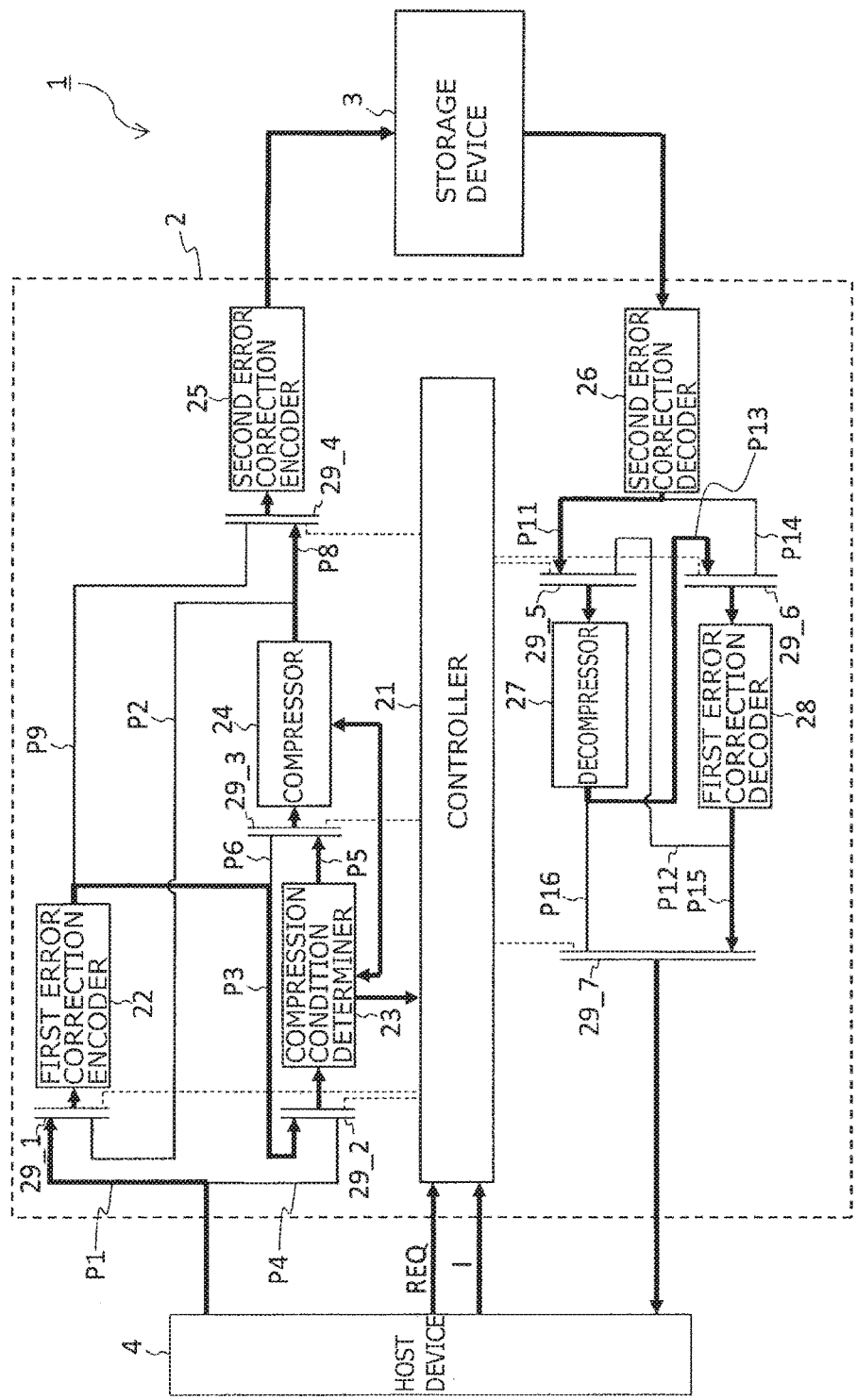
FIG. 2 is a diagram illustrating data paths for writing to and reading from a writing target region having a wear degree that is less than a threshold value, in the first embodiment.

Next, there will be described the operations of writing to and reading from a region having a wear degree that is less than the threshold value, in the storage system 1. FIG. 2 is a diagram illustrating data paths in writing to and reading from a region in the storage device 3, the region having a wear degree less than the threshold value.

First, the controller 21 receives, from a host device 4, a write request REQ and wear degree information I. The write request REQ is address information on a writing target region in the storage device 3 that is a destination of writing a first writing target data item. The wear degree information I is information indicating the wear degree of the writing target region. What is described here is an example in which the wear degree information I is received from the host device 4, but the wear degree information I may be stored in the storage device 3 in advance and read from the storage device 3 in response to the write request REQ. Next, the controller 21 determines the wear degree of the writing target region based on the wear degree information I. When the wear degree is determined to be less than the threshold value, the controller 21 outputs selection signals to the selectors such that paths the P1, P3, and P8 are selected.

In addition, the controller 21 records in a metadata manager, for example, information indicating that the wear degree of the writing target region is less than the threshold value.

Next, the first error correction encoder 22 adds the first bits to the first writing target data item that is input through the path P1, to generate a first encoded data item. Then, the first error correction encoder 22 outputs the first encoded data item to the compression condition determiner 23 through the path P3.

Next, the compression condition determiner 23 determines a compression condition based on the first encoded data item input through the path P3. Specifically, the compression condition determiner 23 determines the compression condition that gives the shortest code length of compression conditions including lossy compression, lossless compression, and non-compression.

In addition, the compression conditions may include a compression of a first writing target data item that omits error correction coding using the first error correction encoder 22.

To determine the compression condition that minimizes the code length, the compression condition determiner 23 detects code lengths after performing compression under the respective compression conditions. First, as the code length after performing the lossless compression, the compression condition determiner 23 detects the code length of a data item that is obtained by subjecting the first encoded data item in its original state to tentative encoding, that is, tentative compression. The tentative compression may be performed using the compressor 24. Alternatively, the compression condition determiner 23 may include a compressing element therein and performs the tentative compression using this compressing element.

In addition, the compression condition determiner 23 changes the first encoded data item in a plurality of ways. The compression condition determiner 23 detects, as the code length after performing the lossy compression, a code length of a data item that has the shortest code length of data items obtained by subjecting the changed data items to the tentative compression. Specifically, the compression condition determiner 23 subjects the first encoded data item to a plurality of bit inversions within a range up to the number of the first bits.

Then, the compression condition determiner 23 generates tentatively compressed data items of the first encoded data items having been subjected to the bit inversions. Then, the compression condition determiner 23 compares the code lengths of the tentatively compressed data items to detect the shortest code length. Here, a first encoded data item having been subjected to the bit inversion, the tentatively compressed data item of which has the shortest code length, is determined to be an inverted encoded data item.

Then, the compression condition determiner 23 compares the code length after performing the lossless compression, a code length after performing the lossy compression, and a code length with non-compression to determine a compression condition that gives the shortest code length, and notifies the compression condition to the controller 21 and the compressor 24.

Next, the controller 21 controls a third selector 29_3 to output the data item according to the compression condition determined by the compression condition determiner 23, to the compressor 24. Specifically, in the case of the lossy compression, the controller 21 controls the third selector 29_3 to select the inverted encoded data item.

In addition, in the case of the lossless compression, the controller 21 controls the third selector 29_3 to select the first encoded data item.

In addition, in the case of the non-compression, the controller 21 controls the third selector 29_3 to select the first encoded data item.

Next, the compressor 24 generates, according to the compression condition, a compressed data item of a data item that is input through the selected path. Specifically, in the case of the lossy compression, the compressor 24 generates a compressed data item of the inverted encoded data item. In addition, in the case of the lossless compression, the compressor 24 generates a compressed data item of the first encoded data item. In addition, in the case of the non-compression, the compressor 24 does not compress the first encoded data item and output the first encoded data item in its original state.

Next, the compressor 24 outputs the compressed data item, or the first encoded data item to the second error correction encoder 25 through the path P8.

Next, the second error correction encoder 25 adds second bits to the input data item to generate a second encoded data item. Then, the second error correction encoder 25 writes the second encoded data item to the writing target region in the storage device 3.

Next, there will be described the case where a data item is read from the storage device 3. The controller 21 receives, from the host device 4, a read request REQ and wear degree information I on the reading target region. Note that, the controller 21 may read the wear degree information I on the reading target region that is stored in the storage device 3. The controller 21 detects, based on the wear degree information I, that writing has been performed when the wear degree of the reading target region is less than the threshold value. Upon this detection, the controller 21 controls the fifth to seventh selectors 29_5 to 29_7. That is, the controller 21 control the selectors such that a read data item from the storage device 3 is output after being processed by the second error correction decoder 26 and thereafter being processed by the decompressor 27 and the first error correction decoder 28 in this order.

Next, the second error correction encoder 26 reads a read data item from the storage device 3, from a region to which the read request has been made. The second error correction decoder 26 subjects the read data item to error correction to generate a second decoded data item.

The path P11 is selected by the fifth selector 29_5, and the second decoded data item is input to the decompressor 27.

The decompressor 27 generates a decompressed data item of the second decoded data item. The path P13 is selected by the sixth selector 29_6, and the decompressed data item is input to the first error correction decoder 28.

The first error correction decoder 28 subjects the decompressed data item to error correction to generate a first decoded data item. Then, a path 15 is selected by the seventh selector 29_7, and the first decoded data item is output to the host device 4 as an output data item.

(Writing to and Reading from Writing Target Region Having Wear Degree Equal to or Greater than Threshold Value)

Figure 3:
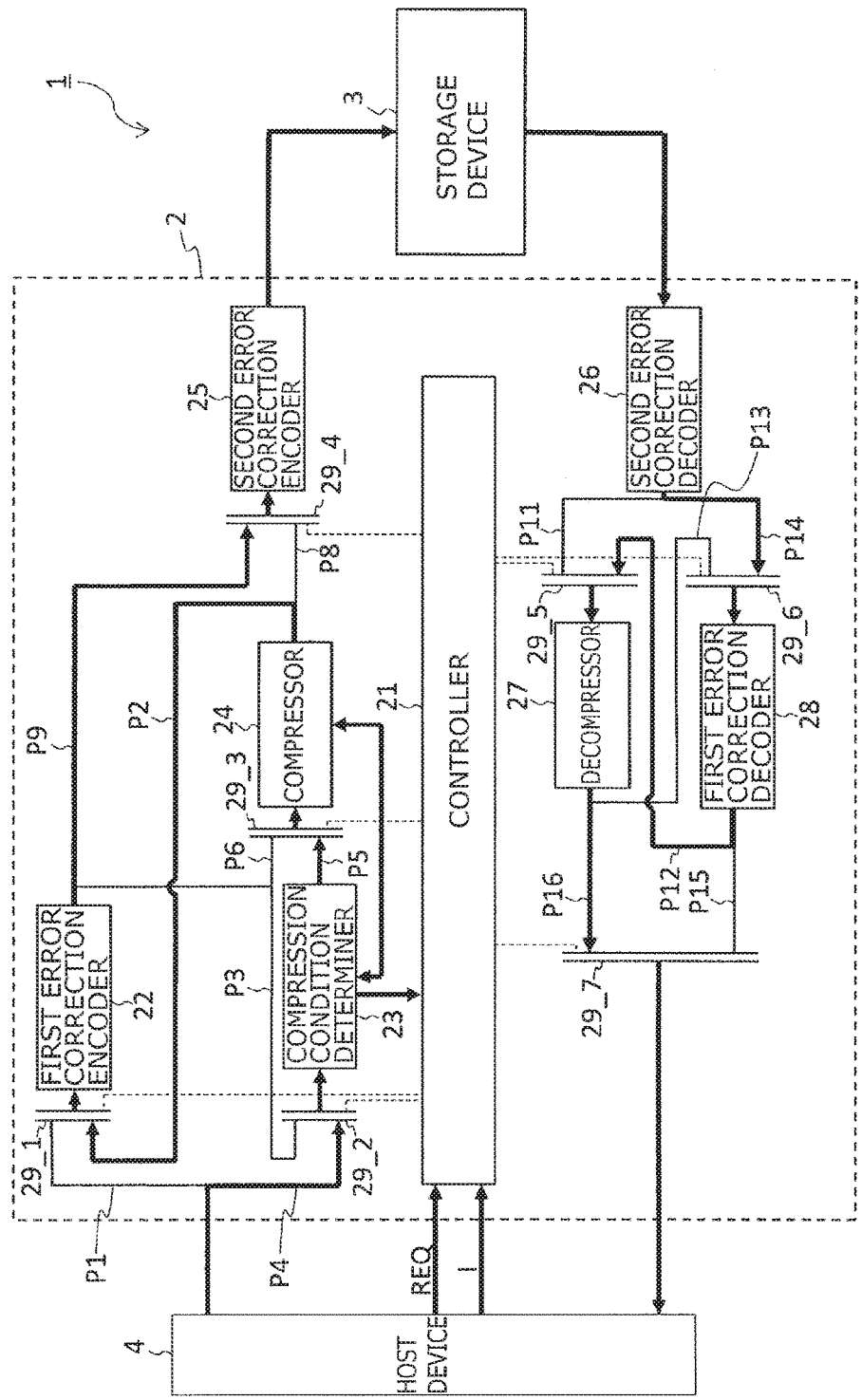
FIG. 3 is a diagram illustrating data paths for writing to and reading from a writing target region having a wear degree that is equal to or greater than the threshold value, in the first embodiment.

Next, there will be described the operations of writing to and reading from a region having a wear degree that is equal to or greater than a threshold value, in the storage system 1. Note that the same points as those of the operations for the region having a wear degree less than the threshold value will not be described. FIG. 3 is a diagram illustrating data paths in writing to and reading from a region having a wear degree equal to or greater than the threshold value.

First, the controller 21 determines the wear degree of the writing target region based on the wear degree information I. When the wear degree is determined to be equal to or greater than the threshold value, the controller 21 outputs selection signals to the selectors such that the paths P4, P5, P2, and P9 are selected.

In addition, the controller 21 records in a metadata manager, for example, information indicating that the wear degree of the writing target region is equal to or greater than the threshold value.

Next, the compression condition determiner 23 determines a compression condition for a first writing target data item that is input through the path P4. When the wear degree is equal to or greater than the threshold value, the compression condition is determined to be the lossless compression or the non-compression. Here, for example, it is assumed that the compression condition determiner 23 determines, as the compression condition, the lossless compression of the first writing target data item by the tentative encoding using the compressor 24.

The compression condition determiner 23 outputs the first writing target data item to the compressor 24.

Next, based on the compression condition, the compressor 24 generates a compressed data item of the first writing target data item and outputs the compressed data item to the first error correction encoder 22, or as the compressed data item, outputs the first writing target data item in its original state to the first error correction encoder 22.

Next, for example, the first error correction encoder 22 adds the first bits to the compressed data item to generate a first encoded data item. Then, the first error correction encoder 22 outputs the first encoded data item to the second error correction encoder 25.

Next, for example, the second error correction encoder 25 adds the second bits to the first encoded data item to generate a second encoded data item. Then, the second error correction encoder 25 writes the second encoded data item to the writing target region in the storage device 3.

As described above, when the wear degree of the writing target region is equal to or greater than the threshold value, a data path: P4, P5, P2, and P9 is formed by the controller 21, and the second encoded data item is written to the storage device 3.

Note that the first write data item may be caused to pass through the compressor 24 and the second error correction encoder 25 in this order when the wear degree of the writing target region is equal to or greater than the threshold value. Then, the storage control device 2 writes the second encoded data item having been generated based on the compressed data item of the first writing target data item, to the storage device 3. In this case, the determination of the non-compression is not performed, and the compression condition is determined to be the lossless compression.

Next, there will be described the case where a data item is read from the storage device 3. The controller 21 receives, from the host device 4, a read request REQ and wear degree information I on a reading target region. The controller 21 detects, based on the wear degree information I, that writing has been performed when the wear degree is equal to or greater than the threshold value.

Upon this detection, the controller 21 controls the fifth to seventh selectors 29_5 to 29_7.

The controller 21 controls the selectors such that a read data item is output after being processed by the second error correction decoder 26 and thereafter being processed by the first error correction decoder 28 and the decompressor 27 in this order. Therefore, the order of the processes by the decompressor 27 and the first error correction decoder 28 is reversed when compared with the case where the wear degree is less than the threshold value.

The second error correction decoder 26 subjects the read data item to error correction to generate a second decoded data item. The path P14 is selected by the sixth selector 29_6, and the second decoded data item is output to the first error correction decoder 28.

Next, the first error correction decoder 28 generates a first decoded data item that is obtained by subjecting the second decoded data item to error correction. The path P12 is selected by the fifth selector 29_5, and the first decoded data item is output to the decompressor 27.

Next, the decompressor 27 generates a decompressed data item of the first decoded data item. The path P16 is selected by the seventh selector 29_7, and the decompressed data item is output, as an output data item, to the host device 4.

As described above, in the first embodiment, when the wear degree of the writing target region is less than the threshold value, it is possible to select the lossy compression with a change of the first encoded data item using the error correction capability of the first error correction encoder 22. By performing the lossy compression, it is possible to reduce the amount of data writing.

If the first encoded data item is changed outside the range within which the error correction can be made, it is difficult to perform the error correction using the first encoded data item. In contrast to this, in the first embodiment, a range for changing the first encoded data item in the lossy compression can be limited to the range within which the error correction can be performed with the first encoded data item, and thus it is possible to assure error correction.

Therefore, according to the first embodiment, even when a writing target region is worn little as in FOB, it is possible to reduce the amount of data writing sufficiently while securing an error correction accuracy. In addition, by reducing the amount of data writing, it is possible to improve the lifetime of the storage device 3, as well as to reduce electricity necessary for writing.

Second Embodiment

Next, as a second embodiment, there will be described a storage system 1 that controls, with software, how to store a data item using lossy compression. Note that, in the explication of the second embodiment, constituent components corresponding to those in the first embodiment are denoted by the same reference characters, and the duplicated explications thereof will not be made.

Figure 4:
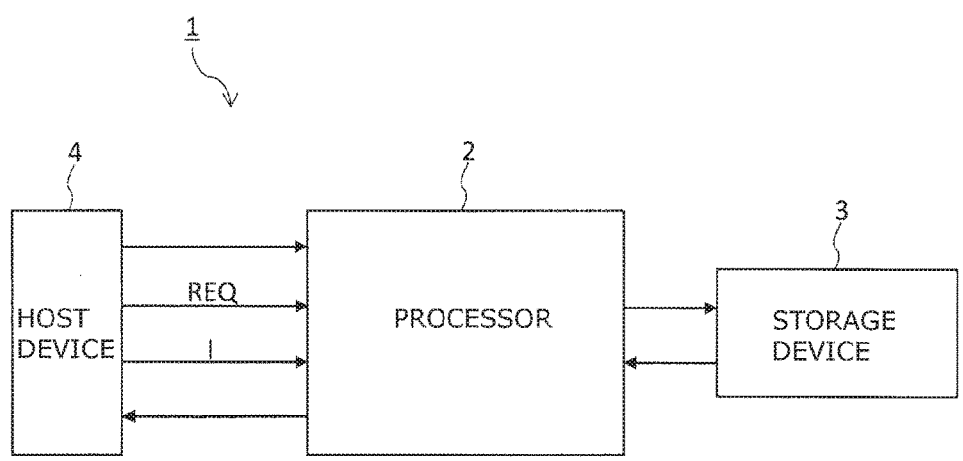
FIG. 4 is a diagram of a storage system illustrating a second embodiment.

FIG. 4 is a diagram of the storage system 1 illustrating the second embodiment. A storage control device in the second embodiment is a processor 2 that performs a process according to a piece of software. The processor 2 has the same functions as those of the components of the first embodiment.

(Data Writing)

Figure 5:
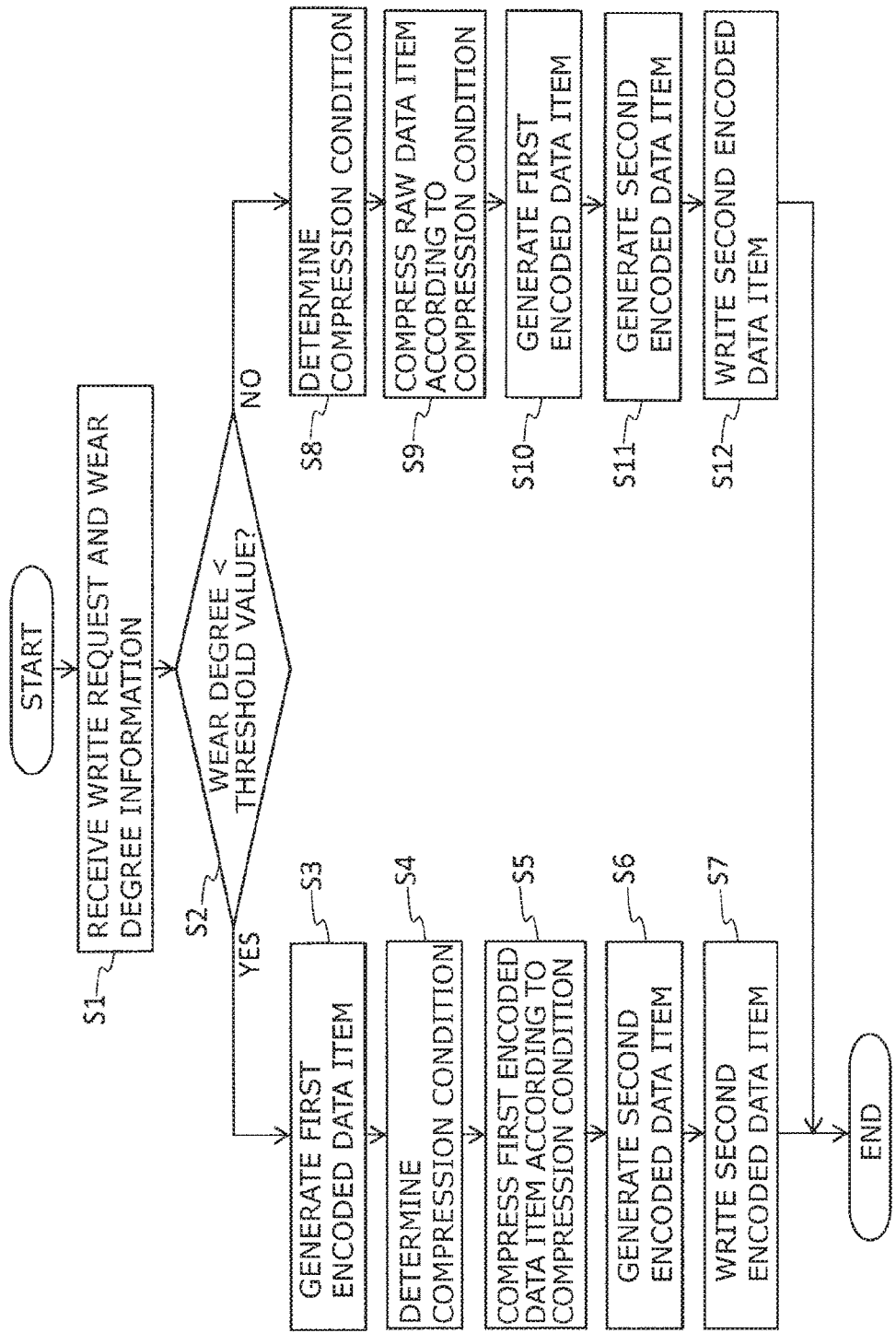
FIG. 5 a flowchart of data writing in the second embodiment.

The data writing operation of the storage system 1 will be described. FIG. 5 is a flowchart of data writing performed by the storage system 1 illustrated in FIG. 4.

First, the processor 2 receives, from the host device 4, a write request REQ, a first writing target data item D1, and wear degree information I (S1). What is described here is an example in which the wear degree information I is received from the host device 4, but the wear degree information I may be stored in the storage device 3 in advance and read from the storage device 3 in response to the write request REQ. Next, the processor 2 determines, based on the wear degree information I, whether or not the wear degree of a writing target region in the storage device 3 is less than the threshold value (S2).

Now, there will be first described a process of the case where the wear degree is less than the threshold value (S2: Yes). When the wear degree is less than the threshold value, the processor 2 adds, for example, first bits to the first writing target data item D1 to generate a first encoded data item (S3).

Next, the processor 2 determines a compression condition based on the first encoded data item (S4).

As in the first embodiment, the processor 2 determines a compression condition that gives the shortest code length of a plurality of compression conditions including the lossy compression.

Next, the processor 2 compresses the first encoded data item according to the compression condition to generate a compressed data item (S5).

Next, the processor 2 adds, for example, second bits to a compressed data item to generate a second encoded data item (S6).

Next, the processor 2 writes the second encoded data item to the writing target region (S7).

Next, there will be described a process of the case where the wear degree is equal to or greater than the threshold value (S2: No). When the wear degree is equal to or greater than the threshold value, the processor 2 determines a compression condition for the first writing target data item D1 (S8). The processor 2 determines, of the lossless compression and the non-compression of the first writing target data, a compression condition that gives the shortest code length. Note that, when the wear degree is equal to or greater than the threshold value, the processor 2 may not compare code lengths and determine the lossless compression as the compression condition.

Next, the processor 2 compresses the first writing target data item according to the compression condition to generate a compressed data item (S9).

Next, the processor 2 adds, for example, first bits to the compressed data item to generate a first encoded data item (S10).

Next, the processor 2 adds, for example, the second bits to the first encoded data item to generate a second encoded data item (S11). Next, the processor 2 writes the second encoded data item to the writing target region (S12).

Note that, when the compression condition is the lossless compression, the first encoded data item may not be generated from the compressed data item, and, for example, the second bits may be added to the compressed data item to generate the second encoded data item, which is written to the writing target region.

(Data Reading)

Figure 6:
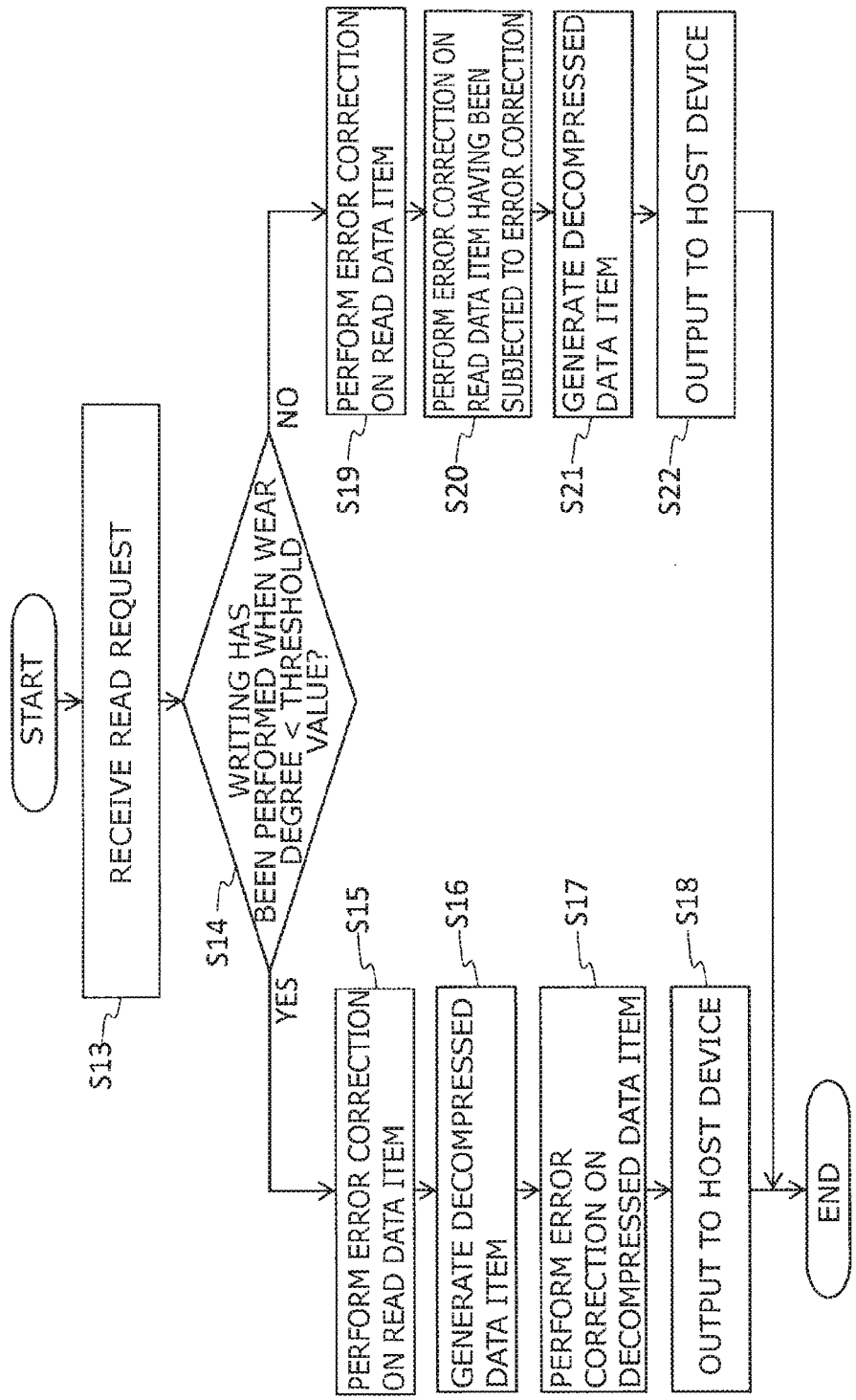
FIG. 6 is a flowchart of data reading in the second embodiment.

Next, the data reading operation of the storage system 1 will be described. FIG. 6 is a flowchart of data reading performed by the storage system 1 illustrated in FIG. 4.

First, the processor 2 receives a read request from the host device 4 (S13).

Next, the processor 2 determines, based on information read from a reading target region indicating whether or not the wear degree is less than the threshold value, whether or not writing to the reading target region has been performed when the wear degree is less than the threshold value (S14).

Now, there will be first described a process in the case where the writing to the reading target region has been performed when the wear degree is less than the threshold value (S14: Yes). In this case, the processor 2 subjects a read data item from the reading target region to error correction (S15). That is, the processor 2 functions as with the second error correction decoder 26 in the first embodiment.

Next, the processor 2 generates a decompressed data item of the read data item having been subjected to the error correction (S16). That is, the processor 2 functions as with the decompressor 27 in the first embodiment.

Next, the processor 2 subjects the decompressed data item to error correction (S17). That is, the processor 2 functions as with the first error correction decoder 28.

Next, the processor 2 outputs a data item that has been subjected to the error correction based on the first error correction code, to the host device 4 (S18).

Next, there will be described a process in the case where writing to the reading target region is performed when the wear degree is equal to or greater than the threshold value (S14: No). In this case, the processor 2 functions as with the second error correction decoder 26 and subjects the read data item from the reading target region to the error correction (S19).

Next, the processor 2 functions as with the first error correction decoder 28 and subjects the read data item that has been subjected to the error correction to error correction (S20).

Next, the processor 2 functions as with the decompressor 27 and generates a decompressed data item of the read data item having been subjected to the error correction (S21).

Next, the processor 2 outputs, to the host device 4, a decompressed data item of the read data item having been subjected to the error correction (S22).

Also in the second embodiment, when the wear degree of the writing target region is less than the threshold value, it is possible to reduce the amount of data writing by performing the lossy compression with a change of the first error correction code using the error correction capability of the first error correction code. In addition, a range for changing the first error correction code in the lossy compression can be limited to the range within which the error correction can be performed with the first error correction code, and thus it is possible to assure error correction.

In addition, in the second embodiment, data processing such as the error correction coding, the error correction, the compression, and the decompression can be performed with software, and thus it is possible to implement flexible writing/reading that is not subject to the constraint of a circuit arrangement.

Note that, in the first and second embodiments, a second writing target data item that is not subjected to error correction coding by the addition of the second bits may be written.

At least part of the storage system according to the present embodiment may be configured in the form of hardware or software. In the case of the configuration in the form of software, a program that implements the function of the at least part of the storage system may be stored in a recording medium such as a flexible disk and a CD-ROM, and executed by being read to a computer. The recording medium is not limited to removable one such as a magnetic disk and an optical disk, and may be an irremovable recording medium such as a hard disk device and a memory. In addition, the program that implements the function of the at least part of the storage system may be distributed over a communication line (including a wireless communication) such as the Internet. Furthermore, the program may be distributed over a wired connection or a wireless connection, such as the Internet, or by being stored in a recording medium, with the program encrypted, modulated, or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A storage control device comprising:
a controller that receives a request to write a data item and determines whether or not a wear degree of a target region in a storage device is less than a threshold value, the target region being a region to which the data item is written;
a compression condition determiner that determines, based on the wear degree, a compression condition out of a plurality of compression conditions including lossy compression, the compression conditions indicating how to compress the data item;
a first error correction encoder that adds an error correction code to the data item when the wear degree is less than the threshold value to generate a first encoded data item; and
a compressor that generates a compressed data item of the first encoded data item based on the compression condition,
wherein the compression condition determiner determines the compression condition that performs lossy compression capable of correcting the error and has a shortest code length of the compressed data item.

2. The storage control device according to claim 1, wherein the change is bit inversion.

3. The storage control device according to claim 1, wherein when the wear degree is determined to be less than the threshold value, the compression condition determiner compares the plurality of compression conditions including the lossy compression, lossless compression of the data item, and non-compression of the data item, and determines a compression condition of a compressed data item that has a shortest code length among a plurality of compressed data items generated by the plurality of compression conditions.

4. The storage control device according to claim 3, wherein when the lossy compression is determined, the controller performs control such that the compressor compresses the data item having been changed, when the lossless compression is determined, the controller performs control such that the compressor compresses the data item, and when the non-compression is determined, the controller controls the compressor such that the compressor does not compress the data item.

5. The storage control device according to claim 1, wherein the controller determines, based on a number of writings to the writing target region, whether or not the wear degree is less than the threshold value.

6. The storage control device according to claim 5, wherein the controller determines, based on defective information on the writing target region, whether or not the wear degree is less than the threshold value.

7. The storage control device according to claim 5, wherein the controller determines, based on writing-reading error information on the writing target region, whether or not the wear degree is less than the threshold value.

8. The storage control device according to claim 7, further comprising:
a decompressor that generates a decompressed data item of a read data item read from a reading target region in the storage device; and
a first error correction decoder that subjects the decompressed data item to error correction.

9. The storage control device according to claim 8 further comprising a second error correction decoder that subjects the read data item to error correction before the error correction by the first error correction decoder.

10. The storage control device according to claim 8, wherein the controller records, to the writing target region, information indicating whether or not a wear degree of the writing target region is less than the threshold value, and controls an order of the decompression and the error correction based on the information.

11. The storage control device according to claim 1, further comprising a second error correction encoder that is disposed in a stage subsequent to the compressor and the error correction encoder and generates a second encoded data item based on a data item output from the compressor or the first error correction encoder.

12. The storage control device according to claim 11, wherein
when the lossy compression is determined, the second error correction encoder generates the second encoded data item based on a compressed data item of the data item having been changed, and
when the lossy compression is determined, the controller perform control to write the second error correction code through a data path that passes through the error correction encoder, the compression condition determiner, the compressor, and the second error correction encoder in this order.

13. The storage control device according to claim 11, wherein
when the wear degree is determined to be equal to or greater than the threshold value, the second error correction encoder generates the second encoded data item based on a compressed data item of the data item, and
when the wear degree is determined to be equal to or greater than the threshold value, the controller performs control to write the second encoded data item through a data path that passes through the error correction encoder, the compressor, and the second error correction encoder in this order.

14. The storage control device according to claim 11, wherein
when the wear degree is determined to be equal to or greater than the threshold value, the first error correction encoder generates an encoded data item based on a compressed data item of the first writing target data item, and when the wear degree is determined to be equal to or greater than the threshold value, the second error correction encoder generates the second encoded data item based on the encoded data item, and
when the wear degree is determined to be equal to or greater than the threshold value, the controller performs control to write the second encoded data item through a data path that passes through the compressor, the error correction encoder, and the second error correction encoder in this order.

15. A storage system comprising:
a controller that receives a request to write a data item and determines whether or not a wear degree of a target region in a storage device is less than a threshold value, the target region being a region to which the data item is written;
a compression condition determiner that determines, based on the wear degree, a compression condition out of a plurality of conditions including lossy compression, the compression conditions indicating how to compress the data item;
a first error correction encoder that adds an error correction code to the data item when the wear degree is less than the threshold value to generate a first encoded data item; and
a compressor that generates a compressed data item of the first encoded data item based on the compression condition,
wherein the compression condition determiner determines the compression condition that performs lossy compression capable of correcting the error and has a shortest code length of the compressed data item.

16. A storage control method comprising:
receiving a request to write a data item and determining whether or not a wear degree of a target region in a storage device is less than a threshold value, the target region being a region to which the data item is written;
determining, based on the wear degree, a compression condition out of a plurality of compression conditions including lossy compression, the compression conditions indicating how to compress the data item;
adding an error correction code to the data item when the wear degree is less than the threshold value to generate a first encoded data item; and
generating a compressed data item of the first encoded data item based on the compression condition,
wherein the determining determines the compression condition that performs lossy compression capable of correcting the error and has a shortest code length of the compressed data item.

* * * * *